(12) United States Patent
Yamazaki et al.

(10) Patent No.: US 9,093,250 B2
(45) Date of Patent: Jul. 28, 2015

(54) SCANNING TRANSMISSION ELECTRON MICROSCOPE SYSTEM, IMAGE PROCESSING METHOD, AND IMAGE PROCESSING APPARATUS

(71) Applicant: FUJITSU LIMITED, Kawasaki-shi, Kanagawa (JP)

(72) Inventors: Takashi Yamazaki, Kawasaki (JP); Yasutoshi Kotaka, Sagamihara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/483,522

(22) Filed: Sep. 11, 2014

(65) Prior Publication Data

US 2015/0115155 A1    Apr. 30, 2015

(51) Int. Cl.
*H01J 37/28* (2006.01)
*H01J 37/244* (2006.01)
*G01N 23/04* (2006.01)
*G01N 13/12* (2006.01)
*H01J 37/22* (2006.01)

(52) U.S. Cl.
CPC ............. *H01J 37/222* (2013.01); *H01J 37/28* (2013.01)

(58) Field of Classification Search
CPC .............. H01J 37/28; H01J 2237/2802; H01J 2237/221; H01J 37/1474; H01J 37/153; H01J 2237/057; H01J 2237/24455; H01J 37/05; G01N 23/225; G01N 23/2251
USPC ............. 250/311, 310, 306, 307, 397
See application file for complete search history.

(56) References Cited

U.S. PATENT DOCUMENTS

| | | | |
|---|---|---|---|
| 8,624,184 B1 * | 1/2014 | Souza et al. | 250/307 |
| 8,642,959 B2 * | 2/2014 | Wang | 250/311 |
| 2004/0000641 A1 | 1/2004 | Taniguchi et al. | |
| 2006/0151701 A1 * | 7/2006 | Tsuneta et al. | 250/310 |
| 2009/0078868 A1 * | 3/2009 | de Jonge | 250/310 |
| 2013/0043386 A1 | 2/2013 | Yamazaki | |

FOREIGN PATENT DOCUMENTS

| | | |
|---|---|---|
| JP | 2001-266783 A1 | 9/2001 |
| JP | 2003-329618 A1 | 11/2003 |

* cited by examiner

*Primary Examiner* — Nikita Wells
(74) *Attorney, Agent, or Firm* — Kratz, Quintos & Hanson, LLP (57) ABSTRACT

A scanning transmission electron microscope system includes: an annular dark-field detector; an electron energy loss spectroscopic apparatus configured to acquire an electron energy loss spectroscopy spectrum of a first electron beam from the annular dark-field detector; and an image processing apparatus configured to generate a first STEM image based on an output signal from the annular dark-field detector and generate a second STEM image based on an integrated value of the electron energy loss spectroscopy spectrum.

15 Claims, 8 Drawing Sheets

SCANNING TRANSMISSION ELECTRON MICROSCOPE SYSTEM, IMAGE PROCESSING METHOD, AND IMAGE PROCESSING APPARATUS

CROSS-REFERENCE TO RELATED APPLICATION

This application is based upon and claims the benefit of priority of the prior Japanese Patent Application No. 2013-221388, filed on Oct. 24, 2013, the entire contents of which are incorporated herein by reference.

FIELD

Embodiments discussed herein are related to a scanning transmission electron microscope system, an image processing method, and an image processing apparatus.

BACKGROUND

In the techniques of acquiring high-resolution images using an electron microscope, such a technique has been developed in which all elements are detected to acquire images. By using the high-angle annular dark-field scanning transmission electron microscopy (HAADF STEM) method, relatively heavy elements are detected. By using the annular bright-field STEM (ABF STEM) method, heavy elements and light elements are simultaneously imaged at an atomic level.

Japanese Laid-open Patent Publication No. 2013-41761 or a non-patent document Appl. Phys. Lett. Vol. 101, p. 133107 discloses an example of related art.

SUMMARY

According to an aspect of the embodiment, a scanning transmission electron microscope system includes: an annular dark-field detector; an electron energy loss spectroscopic apparatus configured to acquire an electron energy loss spectroscopy spectrum of a first electron beam from the annular dark-field detector; and an image processing apparatus configured to generate a first STEM image based on an output signal from the annular dark-field detector and generate a second STEM image based on an integrated value of the electron energy loss spectroscopy spectrum.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 8A to 8D illustrate an example of image processing.

DESCRIPTION OF EMBODIMENT

By using an image processing technique and a bright-field detector, an image similar to an ABF STEM image is acquired from image processing. When a bright-field image (middle-angle bright-field (MABF) STEM image) acquired by a disk-shaped detector at a middle capturing angle and a HAADF STEM image are superimposed in a different color space, light elements and heavy elements are simultaneously detected while keeping high spatial discrimination (double detector STEM method).

In the disk-shaped detector, a structure image and electron energy loss spectroscopy (EELS) are acquired simultaneously. In an ABF STEM image, the relationship between the structure and the electronic structure obtained by the electron spectroscopy is acquired. However, when the ABF STEM image is processed based on the bright-field image, electrons transmitting a sample are detected by the disk-shaped bright-field detector and do not reach a spectroscope disposed under the disk-shaped bright-field detector, and thus, the simultaneous spectroscopy may not be achieved.

Figure 1:
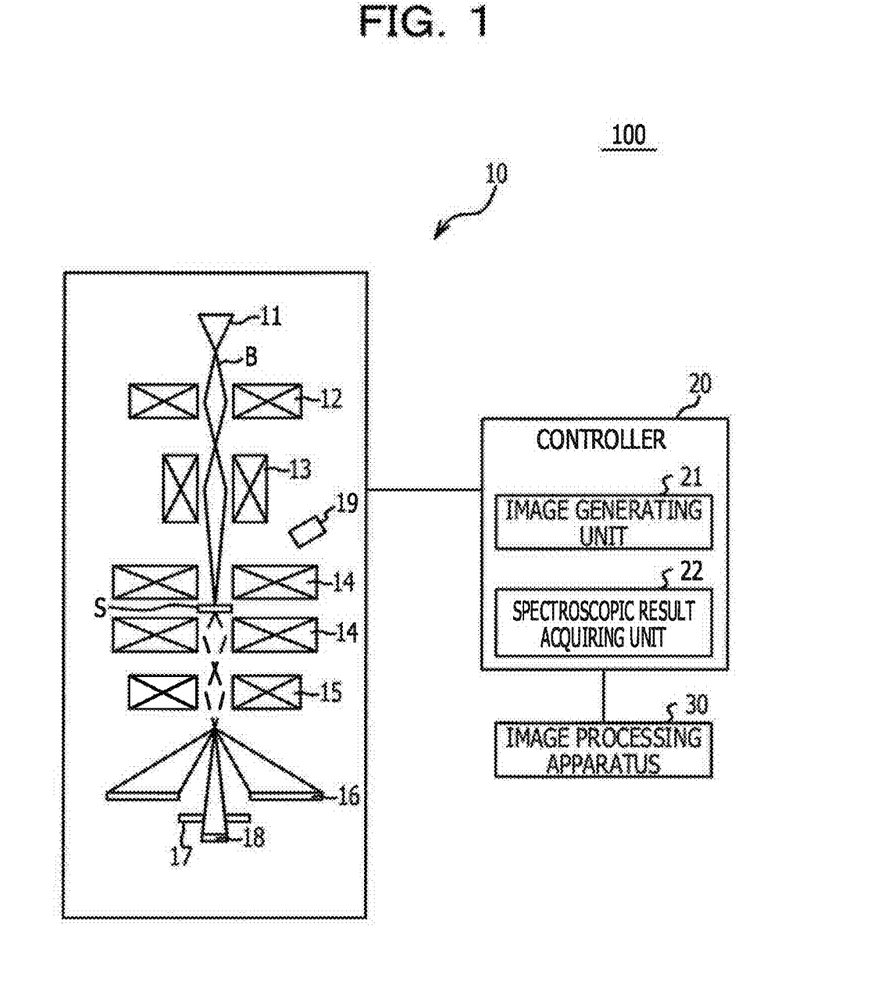
FIG. 1 illustrates an example of a scanning transmission electron microscope system.
Figure 2:
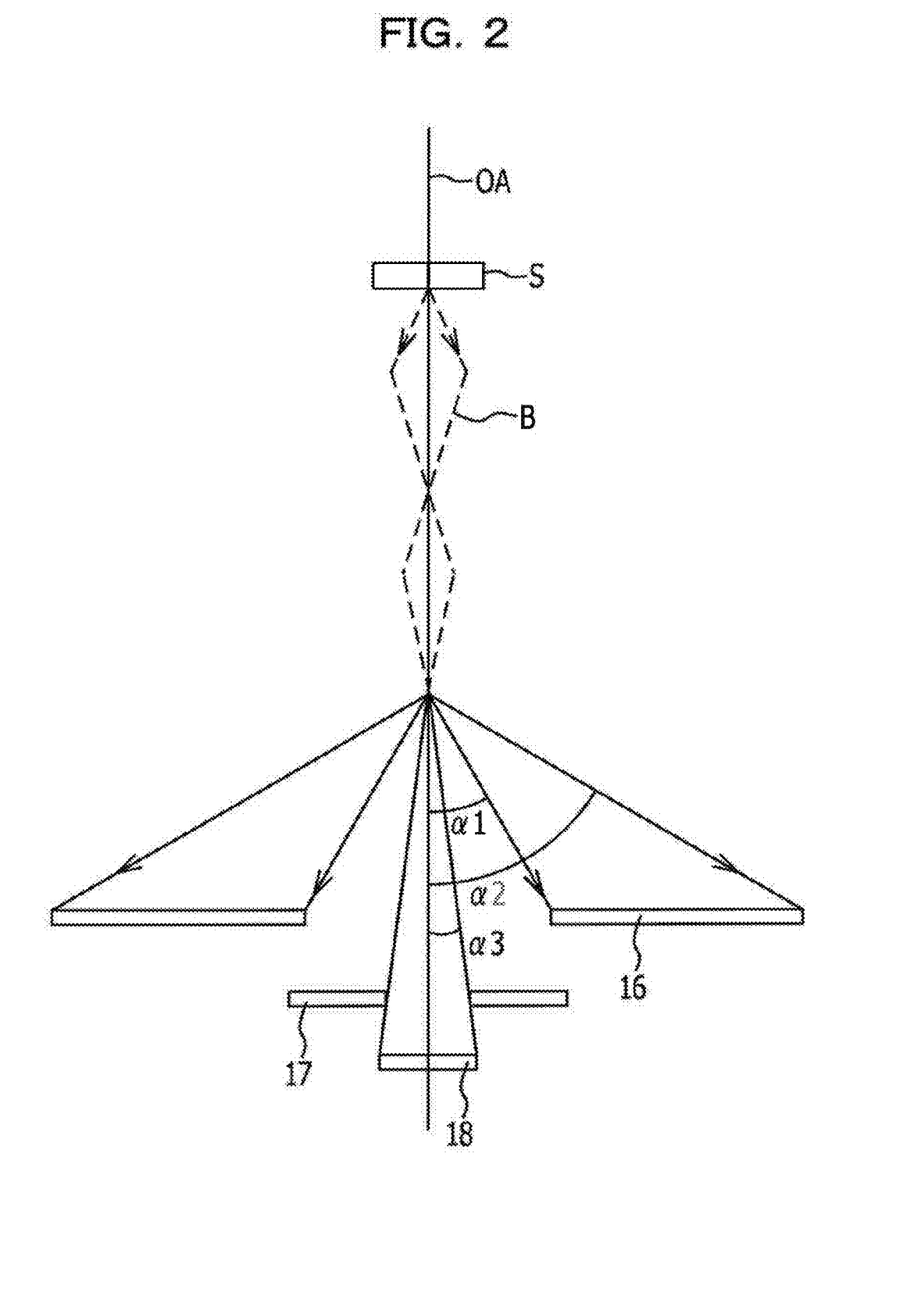
FIG. 2 illustrates an example of a scanning transmission electron microscope system.
Figure 3:
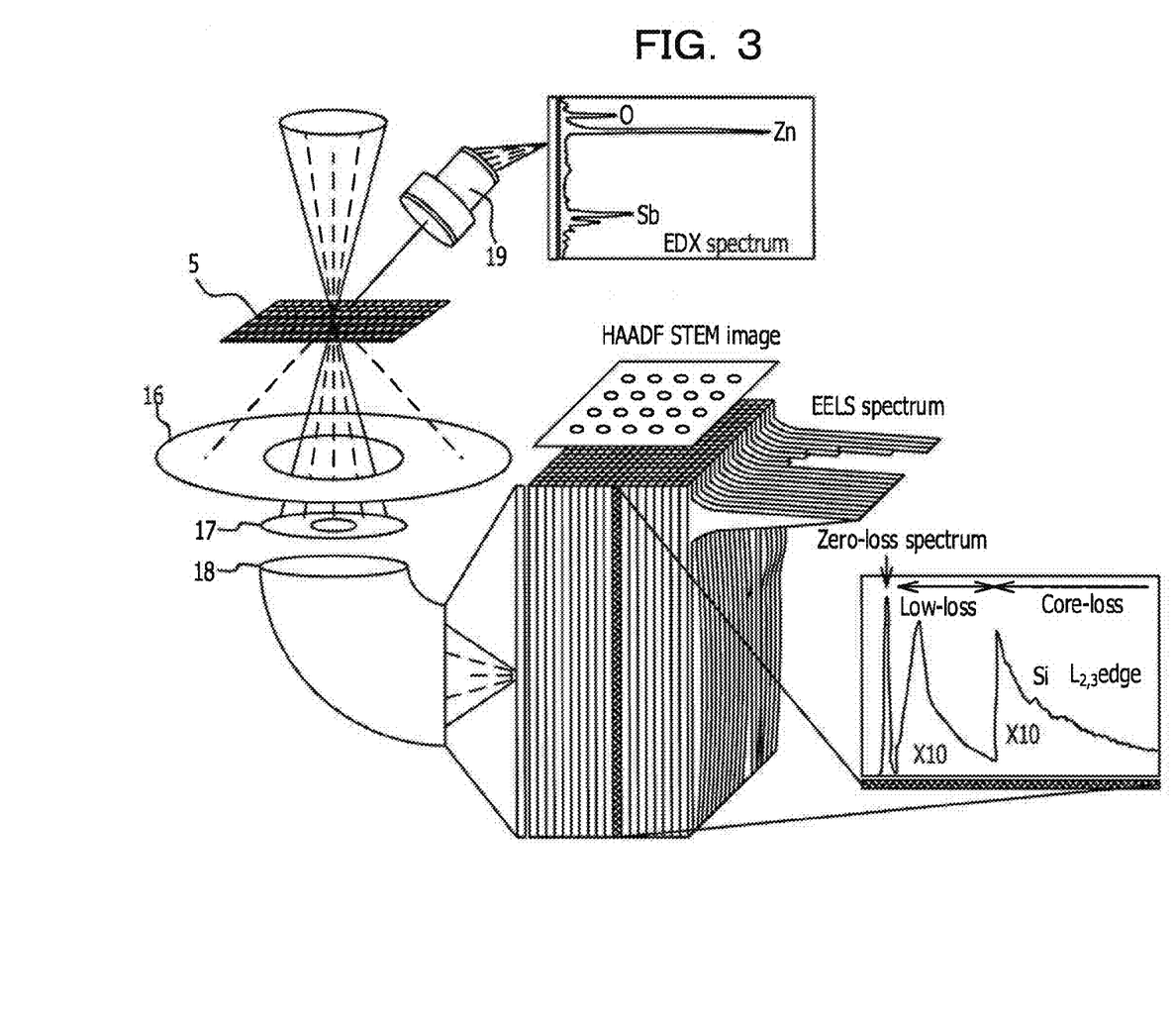
FIG. 3 illustrates an example of a dark-field image and a spectroscopic result from EELS.

FIGS. 1 and 2 illustrate an example of a scanning transmission electron microscope system. FIG. 2 illustrates a main section of the scanning transmission electron microscope system illustrated in FIG. 1. FIG. 3 illustrates an example of a dark-field image and a spectroscopic result of EELS. In FIG. 3, dark-field image and a spectroscopic result obtained by a scanning transmission electron microscope system 100. As illustrated in FIG. 1, the scanning transmission electron microscope system 100 includes a scanning transmission electron microscope 10 and an image processing apparatus 30 that performs image processing using the dark-field image acquired by the scanning transmission electron microscope 10 and the spectroscopic result.

A sample S to be observed by the scanning transmission electron microscope 10 may include a periodic structure including a plural kind of elements having different atomic numbers, as an example. The element that has a larger atomic number is a heavy atom of which the mass is relatively large and may be referred to as a heavy element. The element that has a smaller atomic number is a light atom of which the mass is relatively small and may be referred to as a light element.

The scanning transmission electron microscope 10 includes an electron source 11 that outputs an electron beam B, a converging lens 12 that converges the electron beam B output by the electron source 11, and an object lens 14 that focuses a focal point of the electron beam B output from the electron source 11 on a position of the sample S. For example, the converging lens 12 may converge the electron beam B to 1 nm or less. The scanning transmission electron microscope 10 is disposed between the electron source 11 and the object lens 14 and includes a scanning coil 13 that causes the electron beam B to scan the surface of the sample S and an imaging lens 15 that causes the electron beam B having transmitted the sample S to form an image on an image forming surface.

As illustrated in FIG. 2, the scanning transmission electron microscope 10 includes a detector 16 that detects an electron beam scattering between a first angle $\alpha 1$ from an optical axis OA of the scanning transmission electron microscope 10 and a second angle $\alpha 2$ which is larger than the first angle $\alpha 1$. The detector 16 may be an annular dark-field (ADF) detector disposed on an image forming surface on which a dark-field image is formed. The optical axis OA of the scanning transmission electron microscope 10 is substantially identical with optical axes of the object lens 14 and the imaging lens 15.

The scanning transmission electron microscope 10 includes an annular shielding member 17 that shields an electron beam scattering between the first angle α1 and a third angle α3 which is smaller than the first angle α1, in a position lower than the detector 16. The scanning transmission electron microscope 10 includes an EELS spectroscope 18 that performs electron energy loss spectroscopy (EELS) on an electron scattering within the third angle α3. The EELS spectroscope 18 may be an electron energy loss spectroscopic apparatus that acquires an EELS spectrum. The scanning transmission electron microscope 10 includes an EDX spectroscope 19 that performs energy dispersive X-ray spectroscopy (EDX) of the sample S. The EDX spectroscope 19 acquires an EDX spectrum.

The scanning transmission electron microscope 10 includes a controller 20 that controls operations of various units in accordance with an experiment condition input by a user. The controller 20 includes an image generating unit 21 that generates a dark-field image based on a detection signal from the detector 16 and a spectroscopic result acquiring unit 22 that acquires a spectroscopic result from the EELS spectroscope 18. The image generating unit 21 outputs the generated dark-field image to the image processing apparatus 30. The spectroscopic result acquiring unit 22 outputs the acquired spectroscopic result to the image processing apparatus 30.

The scanning transmission electron microscope 10 may include a lens diaphragm that reduces unnecessary spread of electrons or a correcting unit that corrects an aberration such as a spherical aberration or an astigmatism. For example, the scanning transmission electron microscope 10 may be a spherical aberration corrected scanning transmission electron microscope.

The scanning transmission electron microscope 10 scans the surface of the sample S using the electron beam B converged and generates a dark-field image for each point to be scanned to acquire a spectroscopic result. The first angle α1 may be a minimum scattering angle of an electron that is possibly detected by the detector 16. The first angle α1 is an angle at the advancing direction side of an electron from the optical axis OA. The first angle α1 may be large, at least 40 mrad or larger. For example, the first angle α1 may be set to on the order of 70 mrad.

The second angle α2 may be a maximum scattering angle of an electron that is possibly detected by the detector 16. The second angle α2 is an angle at the advancing direction side of an electron from the optical axis OA. The second angle α2 may be large, at least 70 mrad or larger. The second angle α2 may be set to on the order of 180 mrad.

The third angle α3 may be set based on atomic numbers of a heavy element and a light element included in the sample S. The upper limit value of the third angle α3 may be set within the range in which a bright-field image taken using a bright-field detector is not similar to a complementary image of a dark-field image taken using the detector 16 when the bright-field detector is disposed instead of the EELS spectroscope 18 to form a double detector STEM image. For example, when the atomic number of the light element is 8 or smaller, the third angle α3 in the case of accelerating voltage of 200 kV may be set in the range of 9 to 11 mrad.

The image generating unit 21 acquires a diffraction image of an electron beam detected by the detector 16 and counts the number of electrons on the diffraction image surface. The image generating unit 21 may synchronize the count with the positions of incident electrons to set the image intensity. The image generating unit 21 generates a dark-field STEM image from a two-dimensional image acquired by a scan with a converged electron beam. The dark-field STEM image is referred to as a high-angle annular dark-field (HAADF) STEM image. In the dark-field STEM image, an intensity is obtained that corresponds to the atomic number of an element constituting an atomic column in the position of the atomic column. Because the contrast of an image is very insensitive to the focal point of an electromagnetic lens converging an electron beam and the thickness of a sample, an image having an excellent direct atomic character may be acquired. Due to the image forming mechanism, the spatial resolution of the image depends on the diameter to which the converged electron beam is converged. When a spherical aberration corrector is used, the spatial resolution may be 1 nm or lower. Because of the features described above, the dark-field STEM images are widely used in structure analysis.

As illustrated in FIG. 3, the EELS spectroscope 18 acquires an EELS spectrum for each point of which an electron beam enters. The EDX spectroscope 19 acquires an EDX spectrum for each point of which an electron beam enters. As a result, component analysis and electronic state analysis may be performed two-dimensionally. With a spherical aberration corrector for an electromagnetic lens, a large-current incident probe may be formed. A spectrum of the large-current incident probe may be acquired with spatial resolution having atomic resolution.

With the dark-field STEM image and the EELS spectrum simultaneously being acquired, a spectroscopic result from EELS may be acquired at an atomic level for each electron incident position, and an atomic structure and the electronic state corresponding to the atomic structure may be analyzed. However, when a bright-field STEM image is acquired with a disk-shaped bright-field detector being arranged, EELS signals may not be acquired while the positions of light elements are clarified.

Figure 4A:
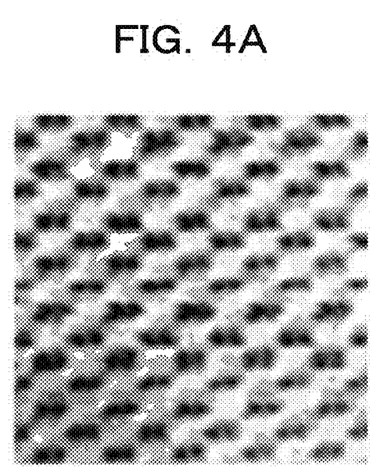
FIGS. 4A to 4D represent image examples.
Figure 4B:
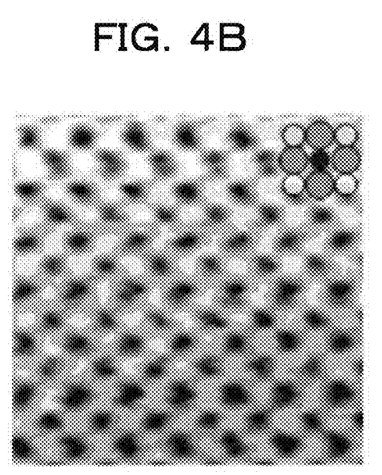
Figure 4C:
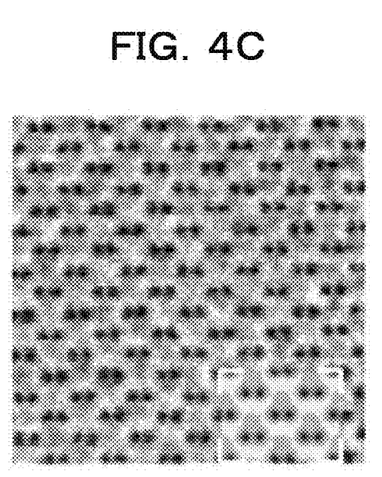
Figure 4D:
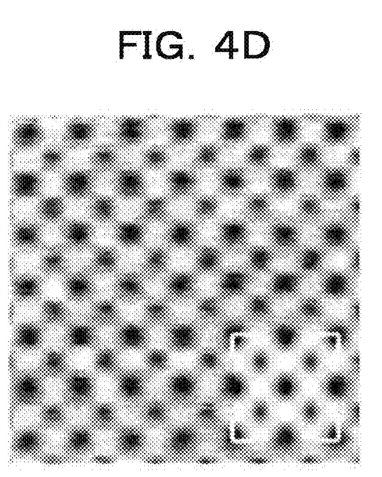

FIGS. 4A to 4D represent image examples. Represented in FIGS. 4A to 4D is a comparison result of images acquired by EELS signals and images acquired by a disk-shaped bright-field detector. FIG. 4A represents a STEM-EELS image acquired using a Si (110). FIG. 4B represents a STEM-EELS image of a $SrT_iO_3$ (001). The images represented in FIGS. 4A and 4B are acquired by integrating EELS signals acquired at all the detected energy channels in each incident position. The capturing angle when the EELS signals are acquired may be set to 20 mrad. FIGS. 4C and 4D represent BF STEM images acquired by the disk-shaped detector. Corresponding calculation results are presented in the lower right regions surrounded by brackets. The capturing angle of the disk-shaped detector for the experiments and the calculations may be set to 20 mrad. In the experiment results of the STEM EELS images and the experiment and calculation results of the BF STEM images acquired by the disk-shaped detector, dark points come in the atom positions. According to the comparison result, the STEM EELS images acquired by integrating all the energy regions are substantially equal to a result of a HABF STEM image.

An electron having reached the EELS spectroscope 18 is subjected to energy spectroscopy and recorded as an electron at a different energy channel. The intensity of a BF STEM image detected by the disk-shaped detector corresponds to the total counted number of electrons reaching the detector. Accordingly, even in the case of electrons dispersed by EELS, if all electrons are counted, intensity may be obtained that is substantially equal to that of a BF STEM image detected by the disk-shaped detector.

By utilizing the results described above, a method and an apparatus may be proposed, with which a light element detection image and a spectroscopic result from EELS are simultaneously acquired. The light element image may be formed based on an MABF STEM image acquired with the capturing angle of the disk-shaped detector set to 9 to 12 mrad. For example, this MABF STEM image and a HAADF STEM image acquired simultaneously may be superimposed in a different color space, whereby light elements and heavy elements may be output substantially simultaneously (double detector STEM technique). For example, an image regarded as an MABF STEM image that is formed by the STEM EELS technique and a HAADF STEM image acquired simultaneously may constitute a double detector STEM image. At this point, because EELS signals are also acquired substantially simultaneously, the double detector STEM image and the EELS signals may be caused to correspond to each other. A shielding member 17 may be arranged such that the capturing angle of the EELS signals becomes substantially identical with that of the MABF STEM image. The capturing angle may be limited by changing the magnification.

Figure 5:
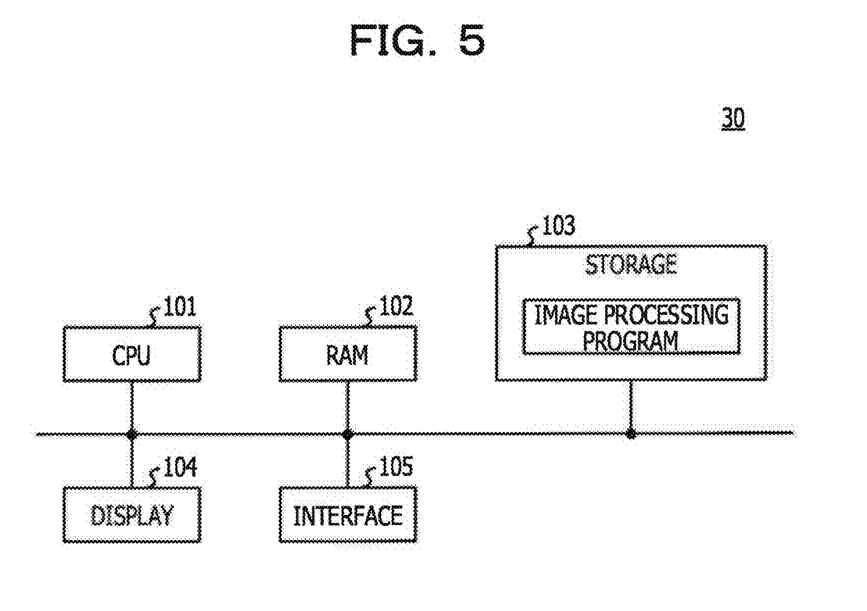
FIG. 5 illustrates an example of an image processing apparatus.

FIG. 5 illustrates an example of an image processing apparatus. In FIG. 5, a hardware configuration of the image processing apparatus 30 is illustrated. The image processing apparatus illustrated in FIG. 5 includes a central processing unit (CPU) 101, a random access memory (RAM) 102, a storage 103, a display 104, an interface 105, and other devices. Each of these devices are coupled via a bus, for example.

The CPU 101 is a central processing unit. The CPU 101 may include one or more cores. The random access memory (RAM) 102 may be a volatile memory that temporarily stores a program executed by the CPU 101, data processed by the CPU 101, or other data. The storage 103 may be a non-volatile storage device. As the storage 103, a solid-state drive (SSD) such as a read only memory (ROM) and a flash memory and a hard disk driven by a hard disk drive may be used, for example. The storage 103 may store an image processing program. The display 104 may be a display such as a liquid-crystal display and an electroluminescence panel, and displays an image processing result, for example. The interface 105 may be a device that performs transmission and reception of signals between the image processing apparatus 30 and an external device. A result from processing performed by the image processing apparatus 30 is output to the outside via the interface 105.

Figure 6:
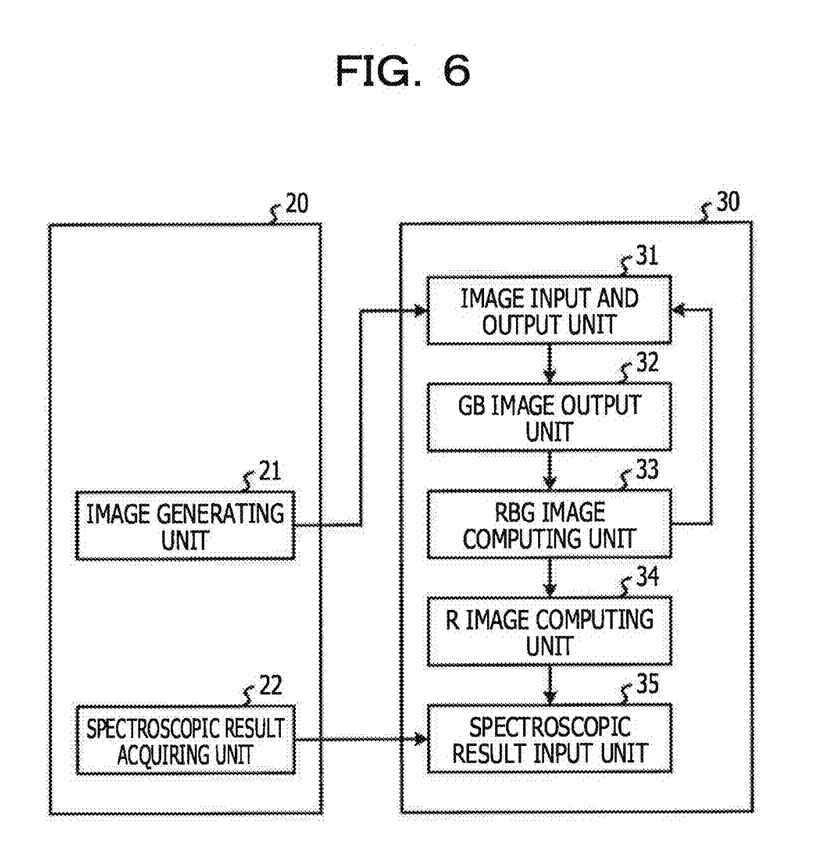
FIG. 6 illustrates an example of an image processing apparatus.

FIG. 6 illustrates an example of an image processing apparatus. In FIG. 6, details of the image processing apparatus 30 illustrated in FIG. 5 are illustrated. As illustrated in FIG. 6, the image processing apparatus 30 may function as an image input and output unit 31, a GB image output unit 32, an RGB image computing unit 33, an R image computing unit 34, or a spectroscopic result input unit 35.

Figure 7:
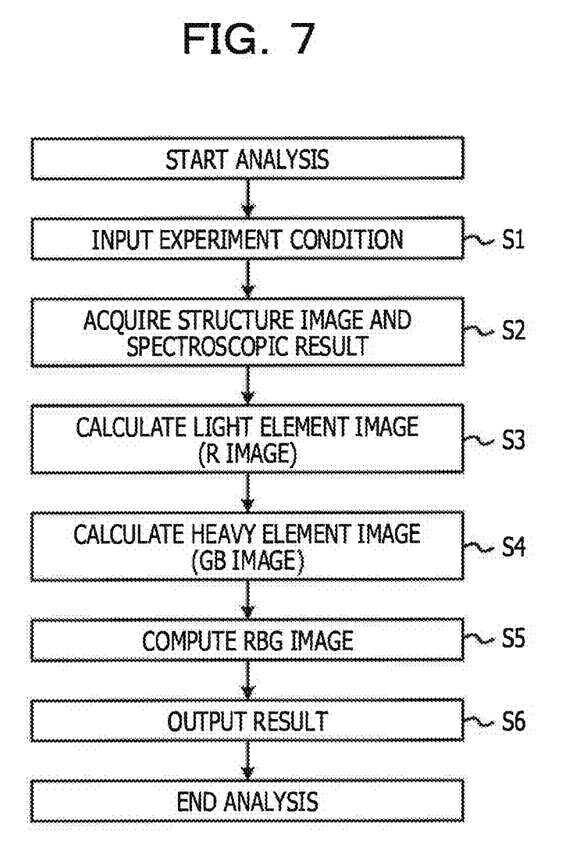
FIG. 7 illustrates an example of an operation of an image processing apparatus.

FIG. 7 illustrates an example of an operation of an image processing apparatus. As illustrated in FIG. 7, an experiment condition is input by the user (operation Si). The experiment condition may include a capturing angle (range), an image resolution, an energy resolution, or the like. The input experiment condition is stored in a memory region of the scanning transmission electron microscope 10 and the like. The image generating unit 21 generates a structure image (HAADF STEM image) based on a detection result from the detector 16 and the spectroscopic result acquiring unit 22 acquires a spectroscopic result from the EELS spectroscope 18 (operation S2). The structure image (HAADF STEM image) generated by the image generating unit 21 is input to the image input and output unit 31. The spectroscopic result acquired by the spectroscopic result acquiring unit 22 is input to the spectroscopic result input unit 35.

The R image computing unit 34 converts an image formed by integrating the spectroscopic results input to the spectroscopic result input unit 35 in the whole energy regions in each incident position into a red image (operation S3). The GB image output unit 32 converts the structure image input to the image input and output unit 31 into a cyan image (operation S4). The conversion into the cyan image may indicate output of an image only with green and blue in an RGB space.

The RGB image computing unit 33 computes an RGB image from the cyan image output by the GB image output unit 32 and the red image output by the R image computing unit 34 (operation S5). For example, the RGB image computing unit 33 superimposes the cyan image and the red image in an RGB space. A double detector STEM image is thus acquired in which a light element is displayed in red and a heavy element is displayed in cyan. At this point, because the spectroscopic results are acquired in each incident position, spectroscopic measurement results corresponding to the atom positions may be acquired. The image processing apparatus 30 outputs the RGB image computed in operation S5 (operation S6). The processing is then terminated.

Figure 8A:
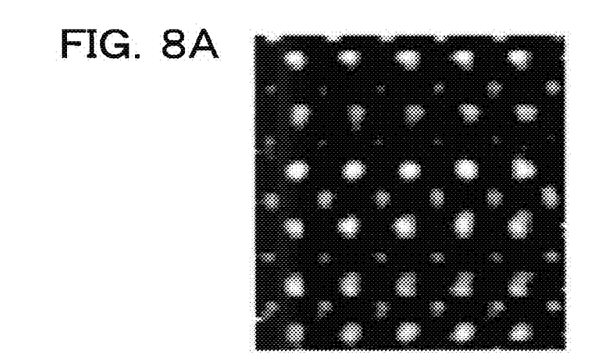
Figure 8B:
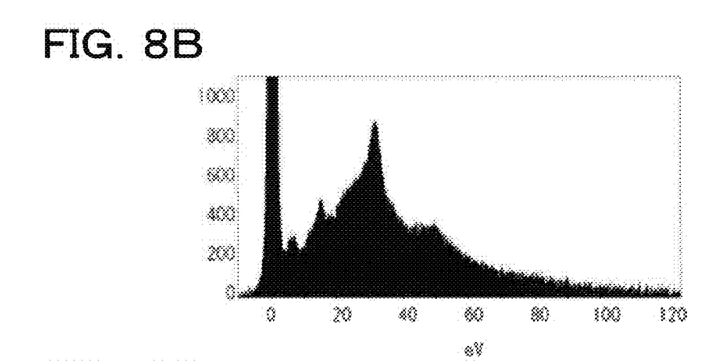
Figure 8D:
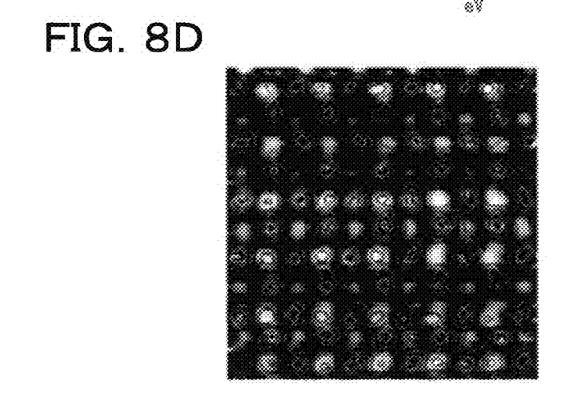

FIGS. 8A to 8D illustrate an example of an image processing. The sample used in FIG. 8 is a single crystal $SrT_iO_3$ (001) sample. FIG. 8A represents an acquired HAADF STEM image. Because the image represented in FIG. 8A is a structure image, the image represented in FIG. 8A is displayed with the color converted into cyan. An EELS signal is acquired in each pixel and the capturing angle of the EELS signal is set to 11 mrad. FIG. 8B represents EELS signals acquired in a representative point. FIG. 8C represents a result from processing in which all energies of the EELS signals represented in FIG. 8B are integrated and output as the intensity of each pixel. The result represented in FIG. 8C corresponds to a MABF STEM image and is thus displayed with the color converted into red. A position in which the intensity is high corresponds to a position of an oxygen. FIG. 8D represents a result from processing in which two results represented in FIGS. 8A and 8C are integrated in an RGB space. As illustrated in FIG. 8D, a position of a light element (oxygen) may be clearly distinguished from positions of heavy elements (strontium and titanium). Because information of the EELS signals are stored in each pixel, an electronic state due to the EELS signals may be analyzed from the images represented in FIGS. 8A, 8C, and 8D.

According to the present embodiment, an EELS spectroscope is used instead of a bright-field detector, whereby EELS spectroscopy and a structure image may be acquired substantially simultaneously. Because a shielding member is disposed in the upper part of the EELS spectroscope, the capturing angle may be set in the substantially same manner as in setting that of the bright-field detector. Not only a shielding member but also changing the magnification (changing the camera length) for a diffraction image may be applied to change the capturing angle. Because spectroscopic spectra are integrated in the whole energy regions included in the spectroscopic results and an integrated intensity map is acquired corresponding to an incident probe, a structure image may be acquired that has information substantially the same as that of a bright-field STEM image. Because a bright-field STEM image is acquired while spectroscopic spectra are acquired, a structure image including from a light element to a heavy element and a spectroscopic result may be acquired.

Detection efficiency of light elements is better with a bright-field image compared with an ABF STEM image. By appropriately setting the energy range of the spectroscope, many kinds of element maps may be acquired. Because the effect of electrons being localized in the atom positions is weak in light elements, it may be difficult to acquire an element map from a spectroscopic measurement result. In the technique described above, a light element is acquired by a bright-field image, so that an element map may be acquired.

By applying to an observation result of the $SrT_iO_3$ observed from the direction of (001), an image may be acquired in which the position of an oxygen is clearly detected as in an image acquired by a bright-field technique. By setting the energy range of the spectroscope to include an L transition of an oxygen may be distinguished based on a bright-field image, $T_i$ may be distinguished based on a spectroscopic image, and Sr may be distinguished based on a HAADF STEM image. For example, a structure image including from a light element to a heavy element and a spectroscopic result may be compared in details.

By using an energy region in which a characteristic peak such as a peak of inner-core excitation spectrum of an element is not present, an energy integration image may be acquired. For example, the EELS spectroscope 18 may acquire an electron energy loss spectroscopy spectrum in an energy region that does not include core excitation spectrum of an element included in the sample S. For example, an RGB color space or other color spaces may be used.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A scanning transmission electron microscope system comprising:
   an annular dark-field detector;
   an electron energy loss spectroscopic apparatus configured to acquire an electron energy loss spectroscopy spectrum of a first electron beam from the annular dark-field detector; and
   an image processing apparatus configured to generate a first STEM image based on an output signal from the annular dark-field detector and generate a second STEM image based on an integrated value of the electron energy loss spectroscopy spectrum.

2. The scanning transmission electron microscope system according to claim 1, further comprising:
   a shielding member configured to limit a capturing range for the electron energy loss spectroscopic apparatus to capture a second electron beam.

3. The scanning transmission electron microscope system according to claim 1, further comprising:
   an annular member disposed between the annular dark-field detector and the electron energy loss spectroscopic apparatus.

4. The scanning transmission electron microscope system according to claim 1,
   wherein the image processing apparatus generates the first STEM image and the second STEM image in different colors and superimposes the first STEM image and the second STEM image.

5. The scanning transmission electron microscope system according to claim 1,
   wherein the image processing apparatus generates the first STEM image in a first color and a second color and generates the second STEM image in a third color that is different from the first color and the second color.

6. The scanning transmission electron microscope system according to claim 5,
   wherein the first color is green, the second color is blue, and the third color is red.

7. The scanning transmission electron microscope system according to claim 1,
   wherein the electron energy loss spectroscopic apparatus acquires an electron energy loss spectroscopy spectrum in an energy region that does not include core excitation spectrum of an element included in a sample.

8. The scanning transmission electron microscope system according to claim 1,
   wherein an inner ring of the annular dark-field detector is disposed at a first angle with respect to a normal line of a surface of the annular dark-field detector,
   an outer ring of the annular dark-field detector is disposed at a second angle with respect to the normal line, and
   the annular dark-field detector detects a third electron beam scattering between the first angle and the second angle.

9. The scanning transmission electron microscope system according to claim 8,
   wherein the electron energy loss spectroscopic apparatus is disposed at a third angle smaller than the first angle with respect to the normal line.

10. An image processing method comprising:
    detecting a first electron beam using an annular dark-field detector;
    acquiring an electron energy loss spectroscopy spectrum of a second electron beam which is not detected by the annular dark-field detector;
    generating a first STEM image based on an output signal from the annular dark-field detector; and
    calculating an integrated value of the electron energy loss spectroscopy spectrum to generate a second STEM image based on the integrated value.

11. The image processing method according to claim 10, further comprising:
    generating the first STEM image and the second STEM image in different colors; and
    superimposing the first STEM image and the second STEM image.

12. The image processing method according to claim 10, further comprising:
    generating the first STEM image in a first color and a second color; and generating the second STEM image in a third color that is different from the first color and the second color.

13. The image processing method according to claim 12,
    wherein the first color is green, the second color is blue, and the third color is red.

14. The image processing method according to claim 10,
    wherein the electron energy loss spectroscopy spectrum is acquired in an energy region that does not include core excitation spectrum of an element included in a sample.

15. An image processing apparatus:
a CPU; and
a memory configured to store a program that is executed by the CPU,
wherein the CPU performs operations based on the program of:
generating a first STEM image based on a first electron beam detected by an annular dark-field detector; and
generating a second STEM image based on an integrated value of an electron energy loss spectroscopy spectrum acquired by an electron energy loss spectroscopic apparatus of a second electron beam which passes through the annular dark-field detector.

* * * * *

UNITED STATES PATENT AND TRADEMARK OFFICE
CERTIFICATE OF CORRECTION

PATENT NO. : 9,093,250 B2  
APPLICATION NO. : 14/483522  
DATED : July 28, 2015  
INVENTOR(S) : Takashi Yamazaki et al.

It is certified that error appears in the above-identified patent and that said Letters Patent is hereby corrected as shown below:

On the Title Page:

Insert item: --(30) Foreign Application Priority Data

JAPAN 2013-221388 October 24, 2013--

Signed and Sealed this
Twelfth Day of April, 2016

Michelle K. Lee
*Director of the United States Patent and Trademark Office*